(12) United States Patent
Kurokawa et al.

(10) Patent No.: US 12,146,915 B2
(45) Date of Patent: Nov. 19, 2024

(54) DETERIORATION ESTIMATION DEVICE AND DETERIORATION ESTIMATION PROGRAM FOR POWER CONVERSION DEVICE

(71) Applicants: NAGASAKI INSTITUTE OF APPLIED SCIENCE, Nagasaki (JP); TMEIC Corporation, Chuo-ku (JP)

(72) Inventors: Fujio Kurokawa, Nagasaki (JP); Ritaka Nakamura, Chuo-ku (JP); Hajime Shiraishi, Chuo-ku (JP)

(73) Assignees: NAGASAKI INSTITUTE OF APPLIED SCIENCE, Nagasaki (JP); TMEIC Corporation, Chuo-ku (JP)

( * ) Notice: Subject to any disclaimer, the term of this patent is extended or adjusted under 35 U.S.C. 154(b) by 53 days.

(21) Appl. No.: 17/995,357

(22) PCT Filed: Mar. 31, 2021

(86) PCT No.: PCT/JP2021/013799
§ 371 (c)(1),
(2) Date: Oct. 3, 2022

(87) PCT Pub. No.: WO2021/201090
PCT Pub. Date: Oct. 7, 2021

(65) Prior Publication Data
US 2023/0152375 A1    May 18, 2023

(30) Foreign Application Priority Data

Apr. 3, 2020 (JP) ................. 2020-067565

(51) Int. Cl.
*G01R 31/327* (2006.01)
*H02M 7/5395* (2006.01)
*H02P 27/08* (2006.01)

(52) U.S. Cl.
CPC ........ *G01R 31/327* (2013.01); *H02M 7/5395* (2013.01); *H02P 27/08* (2013.01)

(58) Field of Classification Search
CPC .... G01R 31/327; H02M 7/5395; H02M 1/32; H02M 7/53871; H02P 27/08
See application file for complete search history.

(56) References Cited

U.S. PATENT DOCUMENTS 5,528,446 A     6/1996  Sankaran et al.
11,329,593 B2 *  5/2022  Hanioka ........... H02M 7/53871
(Continued)

FOREIGN PATENT DOCUMENTS

JP   2003-70231 A    3/2003
JP   2004-317277 A   11/2004
(Continued)

OTHER PUBLICATIONS

International Search Report issued Jun. 29, 2021 in PCT/JP2021/013799 filed Mar. 31, 2021, 2 pages.
(Continued)

*Primary Examiner* — Giovanni Astacio-Oquendo
*Assistant Examiner* — Zannatul Ferdous
(74) *Attorney, Agent, or Firm* — Oblon, McClelland, Maier & Neustadt, L.L.P.

(57) ABSTRACT

Provided is a deterioration estimation device and a deterioration estimation program for a power conversion device that can estimate the deterioration of a switching element without providing a special sensor. A deterioration estimation device includes a calculating device calculating the variation of the characteristics of an IGBT in an inverter from a voltage command treated as a target of the output voltage of the power conversion device and the output voltage value of the power conversion device, a determining device determining whether the variation of the character-
(Continued)

istics calculated by the calculating device has changed from an initial state by a threshold value or greater, and a notifying device issuing a warning when the determining device has determined that the change in the variation of the characteristics is equal to or greater than the threshold value.

5 Claims, 10 Drawing Sheets

(56) References Cited

U.S. PATENT DOCUMENTS

| | | | | |
|---|---|---|---|---|
| 2013/0341109 | A1* | 12/2013 | Ozaki | B60L 50/51 |
| | | | | 324/503 |
| 2014/0376282 | A1* | 12/2014 | Mine | H02M 1/32 |
| | | | | 363/37 |
| 2017/0282720 | A1 | 10/2017 | Sakano et al. | |
| 2019/0207533 | A1* | 7/2019 | Kikuchi | H02M 7/48 |

FOREIGN PATENT DOCUMENTS

| | | |
|---|---|---|
| JP | 2005-45963 A | 2/2005 |
| JP | 2010-148192 A | 7/2010 |

OTHER PUBLICATIONS

International Preliminary Report on Patentability and Written Opinion issued Sep. 29, 2022 in PCT/JP2021/013799, 4 pages.

* cited by examiner (a)

U-PHASE POSITIVE CURRENT HALF-WAVE: UPPER ARM OFF-DELAY INCREASED (4 μs→8 μs), LOWER ARM OFF-DELAY 4 μs (INITIAL STATE)

(b)

U-PHASE NEGATIVE CURRENT HALF-WAVE: UPPER ARM OFF-DELAY INCREASED (4 μs→8 μs), LOWER ARM OFF-DELAY 4 μs (INITIAL STATE)

(a)

U-PHASE POSITIVE CURRENT HALF-WAVE: UPPER ARM OFF-DELAY 4 μS (INITIAL STATE), LOWER ARM OFF-DELAY INCREASED (4 μs→8 μs)

(b)

U-PHASE NEGATIVE CURRENT HALF-WAVE: UPPER ARM OFF-DELAY 4 μS (INITIAL STATE), LOWER ARM OFF-DELAY INCREASED (4 μs→8 μs)

(a)

U-PHASE POSITIVE CURRENT HALF-WAVE: INITIAL STATE (UPPER ARM OFF-DELAY 4 μS, LOWER ARM OFF-DELAY 4 μS)

(b)

U-PHASE NEGATIVE CURRENT HALF-WAVE: INITIAL STATE (UPPER ARM OFF-DELAY 4 μS, LOWER ARM OFF-DELAY 4 μS)

(a) U-PHASE POSITIVE CURRENT HALF-WAVE: UPPER ARM OFF-DELAY INCREASED (4 μs→8 μs), LOWER ARM OFF-DELAY 4 μs (INITIAL STATE)

(b) U-PHASE NEGATIVE CURRENT HALF-WAVE: UPPER ARM OFF-DELAY INCREASED (4 μs→8 μs), LOWER ARM OFF-DELAY 4 μs (INITIAL STATE)

(a)

U-PHASE POSITIVE CURRENT HALF-WAVE: UPPER ARM OFF-DELAY 4 μS (INITIAL STATE), LOWER ARM OFF-DELAY INCREASED (4 μs→8 μs)

(b)

U-PHASE NEGATIVE CURRENT HALF-WAVE: UPPER ARM OFF-DELAY 4 μS (INITIAL STATE), LOWER ARM OFF-DELAY INCREASED (4 μs→8 μs)

DETERIORATION ESTIMATION DEVICE AND DETERIORATION ESTIMATION PROGRAM FOR POWER CONVERSION DEVICE

TECHNICAL FIELD

The present invention relates to a deterioration estimation device and a deterioration estimation program that estimate the deterioration of a switching element used in a power conversion device such as an inverter or a converter.

BACKGROUND ART

In a power conversion device such as a motor drive inverter or a converter for power transmission, power is controlled by controlling the switching width of a switching element for power conversion. The switching element is a key component of a power conversion device, and trouble occurring in the switching element has a large impact, such as causing a device that obtains power from the power conversion device to stop, or causing the entire system to stop.

To prevent trouble from occurring, measures such as replacing semiconductor switching elements for power conversion in an aging device with new switching elements are taken, but there are problems of not only heavy maintenance costs but also a shortage of maintenance personnel. Consequently, it is desirable to provide means for detecting the signs of trouble in a switching element for power conversion in advance and issuing an alarm before the trouble occurs.

In relation to detecting the signs of trouble in advance, the technology disclosed in, for example, Patent Literature 1 is known. The power conversion device disclosed in Patent Literature 1 is provided with leakage current detecting means for detecting a gate leakage current in a semiconductor switching element for power conversion, and element abnormality detecting means for outputting an element abnormality detection signal indicating signs of abnormality when the magnitude of the leakage current changes by a fixed value or greater with reference to the leakage current when the device began to be used.

CITATION LIST

Patent Literature

Patent Literature 1: Japanese Patent Laid-Open No. 2003-70231

SUMMARY OF INVENTION

Technical Problem

However, the power conversion device disclosed in Patent Literature 1 is newly provided with, as the leakage current detecting means between the gate and the emitter of the semiconductor switching element, a VGE detection circuit that detects the gate voltage applied between an interconnection point between the gate resistor and the gate of the semiconductor switching element, and the emitter of the semiconductor switching element.

In a power conversion device, even if means for measuring the input voltage and input current, the output voltage and output current, and the like is provided for conversion control, means for measuring the characteristics of a switching element and providing feedback is not usually provided. Consequently, with the power conversion device disclosed in Patent Literature 1, it is necessary to provide a new, special sensor for the switching element.

There is also a simple method of connecting a resistor and measuring the voltage to measure the leakage current between the gate and the emitter, but if a current flows from the gate control signal, the conditions change between when a switching element is on and when the switching element is off. In this case, the only option is to use special measuring means such as a clamp-on ammeter.

Accordingly, an objective of the present invention is to provide a deterioration estimation device and a deterioration estimation program for a power conversion device that can estimate the deterioration of a switching element without providing a special sensor.

Solution to Problem

A deterioration estimation device for a power conversion device of the present invention includes: calculating means for calculating a variation of characteristics of a switching element for power conversion in the power conversion device from a voltage command treated as a target for an output voltage of the power conversion device and an output voltage value of the power conversion device; determining means for determining whether the variation of the characteristics calculated by the calculating means has changed from an initial state by a threshold value or greater; and notifying means for issuing a warning when the determining means has determined that the change in the variation of the characteristics is equal to or greater than the threshold value, wherein the calculating means includes polarity determining means for determining a polarity of current according to an output current from the power conversion device formed from an upper arm and a lower arm by the switching element, and switching means for switching the variation of the characteristics according to a switching signal from the polarity determining means, and the determining means is provided in a pair for respectively determining the variation of the characteristics switched by the switching means.

Also, a deterioration estimation program for a power conversion device of the present invention causes a computer to function as: calculating means for calculating a variation of characteristics of a switching element for power conversion in the power conversion device from a voltage command treated as a target for an output voltage of the power conversion device and an output voltage value of the power conversion device; determining means for determining whether the variation of the characteristics calculated by the calculating means has changed from an initial state by a threshold value or greater; and notifying means for issuing a warning when the determining means has determined that the change in the variation of the characteristics is equal to or greater than the threshold value, wherein the calculating means includes polarity determining means for determining a polarity of current according to an output current from the power conversion device formed from an upper arm and a lower arm by the switching element, and switching means for switching the variation of the characteristics according to a switching signal from the polarity determining means, and the determining means is provided in a pair for respectively determining the variation of the characteristics switched by the switching means.

According to the present invention, by having the calculating means calculate the variation of the characteristics of the switching element from the voltage command for the power conversion device and the output voltage value of the power conversion device, and by having the determining means determine whether the change in the variation of the characteristics is equal to or greater than a threshold value, the notifying means issues a warning when the determining means has determined that the change in the variation of the characteristics is equal to or greater than the threshold value. The voltage command for the power conversion device and the output voltage value or output current of the power conversion device can be acquired from DC voltage measuring means provided in an inverter and output voltage measuring means or output current measuring means, and therefore it is not necessary to provide a special sensor.

Furthermore, since the switching means can switch between a pair of integrating means depending on the polarity of current determined by the polarity determining means, the change in the variation of the characteristics of each of the upper arm and the lower arm can be calculated. Consequently, signs of trouble in the upper arm and the lower arm can be estimated by the pair of determining means.

The determining means may store and treat the variation of the characteristics corresponding to the output current of the power conversion device as an initial state, and determine the threshold value on the basis of the initial state. With this configuration, the threshold value for the variation of the characteristics can be determined according to the output current, and therefore the deterioration of a switching element can be estimated accurately.

The calculating means may include subtracting means for calculating a difference between the voltage command and the output voltage value, and integrating means for outputting, to the determining means, a differential integral value obtained by integrating the difference calculated by the subtracting means. Since the difference between the voltage command and the output voltage value calculated by the subtracting means is integrated by the integrating means, tiny fluctuations or the like in the voltage value can be ignored, and since the difference is accumulated, signs of deterioration can be magnified.

The integrating means may output an integral value from a definite integral over a predetermined interval as the differential integral value. By calculating the differential integral value with a definite integral over an interval, divergent integral values can be suppressed.

The calculating means may include first averaging means for calculating an average value of an input voltage value into the power conversion device at respective time intervals synchronized with a carrier signal, multiplying means for multiplying the average value of the input voltage value from the first averaging means by a modulation ratio to calculate and output the voltage command to the subtracting means, and second averaging means for calculating and outputting, to the subtracting means, an average value of the output voltage value of the power conversion device at respective time intervals synchronized with the carrier signal. By averaging the input voltage value with the first averaging means and averaging the output voltage value with the second averaging means, during maintenance, a worker can observe the waveforms to grasp the operating state of the power conversion device.

Advantageous Effect of Invention

According to the present invention, the deterioration of a switching element can be estimated without providing a special sensor.

BRIEF DESCRIPTION OF DRAWINGS

FIG. 4 is a diagram illustrating an example of waveforms of an integral value from the integrating means when a three-phase AC motor is driven by an inverter, in which FIG. 4(a) is a diagram illustrating an example of the waveform of the output from one integrating means when the delay of the upper and lower arms is in an initial state and the polarity of the output current is positive, and FIG. 4(b) is a diagram illustrating an example of the waveform of the output from the other integrating means in the delay state of FIG. 4(a) when the polarity of the output current is negative.

FIG. 5 is a diagram illustrating an example of waveforms of an integral value from the integrating means when a three-phase AC motor is driven by an inverter, in which FIG. 5(a) is a diagram illustrating an example of the waveform of the output from one integrating means when the off-delay of the upper arm has increased, the delay of the lower arm is still in the initial state, and the polarity of the output current is positive, and FIG. 5(b) is a diagram illustrating an example of the waveform of the output from the other integrating means in the delay state of FIG. 5(a) when the polarity of the output current is negative.

FIG. 6 is a diagram illustrating an example of waveforms of an integral value from the integrating means when a three-phase AC motor is driven by an inverter, in which FIG. 6(a) is a diagram illustrating an example of the waveform of the output from one integrating means when the delay of the upper arm is still in the initial state, the off-delay of the lower arm has increased, and the polarity of the output current is positive, and FIG. 6(b) is a diagram illustrating an example of the waveform of the output from the other integrating means in the delay state of FIG. 6(a).

FIG. 7 is a diagram illustrating an example of waveforms of the differential integral value over an interval from the integrating means when a three-phase AC motor is driven by an inverter, in which FIG. 7(a) is a diagram illustrating an example of the waveform of the output from one integrating means when the delay of the upper and lower arms is in an initial state and the polarity of the output current is positive, and FIG. 7(h) is a diagram illustrating an example of the waveform of the output from the other integrating means in the delay state of FIG. 7(a) when the polarity of the output current is negative.

FIG. 8 is a diagram illustrating an example of waveforms of the differential integral value over an interval from the integrating means when a three-phase AC motor is driven by an inverter, in which FIG. 8(a) is a diagram illustrating an example of the waveform of the output from one integrating means when the off-delay of the upper arm has increased, the delay of the lower arm is still in the initial state, and the polarity of the output current is positive, and FIG. 8(b) is a diagram illustrating an example of the waveform of the output from the other integrating means in the delay state of FIG. 8(a) when the polarity of the output current is negative.

FIG. 9 is a diagram illustrating an example of waveforms of the differential integral value over an interval from the integrating means when a three-phase AC motor is driven by an inverter, in which FIG. 9(a) is a diagram illustrating an example of the waveform of the output from one integrating means when the delay of the upper arm is still in the initial state, the off-delay of the lower arm has increased, and the polarity of the output current is positive, and FIG. 9(b) is a diagram illustrating an example of the waveform of the output from the other integrating means in the delay state of FIG. 9(a) when the polarity of the output current is negative.

DESCRIPTION OF EMBODIMENTS

Embodiment 1

A deterioration estimation device for a power conversion device according to Embodiment 1 of the present invention will be described on the basis of the drawings.

Figure 1:
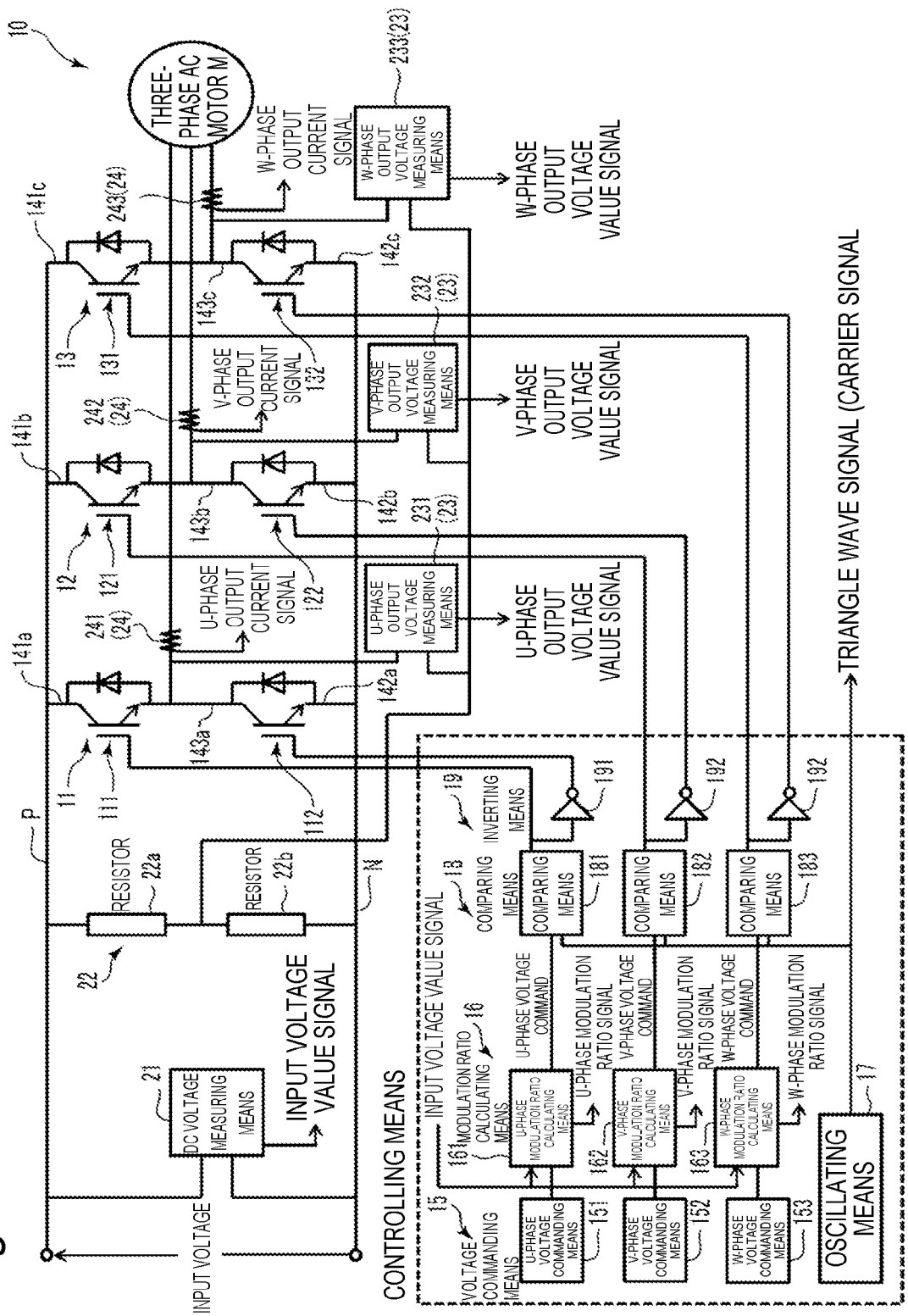
FIG. 1 is a diagram illustrating an example of a power conversion device.

In Embodiment 1, the power conversion device is an inverter 10, as illustrated in FIG. 1. First, the configuration of the inverter 10 will be described.

The inverter 10 according to Embodiment 1 accepts direct current and outputs three-phase alternating current. As illustrated in FIG. 1, a three-phase AC motor M is connected to the inverter 10.

The inverter 10 includes a first arm 11 to a third arm 13, in which upper arms 111, 121, 131 and lower arms 112, 122, 132 are respectively connected in series.

The upper arms 111 to 131 are connected to a positive power line P by first wiring lines 141a to 141c. The lower arms 112 to 132 are connected to a negative power line N by second wiring lines 142a to 142c. The upper arms 111 to 131 and the lower arms 112 to 132 are connected to each other by third wiring lines 143a to 143c.

The upper arms 111 to 131 and the lower arms 112 to 132 are configured by a switching element and a freewheeling diode. The switching element is formed from a semiconductor device. For example, a bipolar transistor, a metal-oxide-semiconductor field-effect transistor (MOSFET), an insulated-gate bipolar transistor (IGBT), or the like can be used as the switching element. In Embodiment 1, an IGBT which allows large currents to flow through and which has a fast switching speed is used as the switching element.

The inverter 10 is provided with controlling means for controlling the switching of the upper arms 111 to 131 and the lower arms 112 to 132 through pulse-width modulation (PWM).

The controlling means is provided with voltage commanding means 15 for outputting a voltage command as a target voltage for the U to W phases, modulation ratio calculating means 16 for outputting a modulation ratio signal from the voltage command from the voltage commanding means 15 and an input voltage value indicated by an input voltage value signal, oscillating means 17 for outputting a carrier signal, comparing means 18 for comparing the modulation ratio signal to a triangle wave signal and outputting a switching signal (gate signal), and inverting means 19 for inverting the switching signals to the upper arms 111 to 131 for the lower arms 112 to 132.

The voltage commanding means 15 is provided with U-phase voltage commanding means 151 for the U phase, V-phase voltage commanding means 152 for the V phase, and W-phase voltage commanding means 153 for the W phase.

From the U-phase voltage commanding means 151, V-phase voltage commanding means 152, and W-phase voltage commanding means 153, a U-phase voltage command, V-phase voltage command, and W-phase voltage command are outputted.

The modulation ratio calculating means 16 is a divider that outputs the modulation ratio by dividing the voltage command from the voltage commanding means 15 by an input voltage value indicated by an input voltage value signal measured by DC voltage measuring means described later. The modulation ratio can be set from −1.0 to 1.0.

The modulation ratio calculating means 16 is provided with U-phase modulation ratio calculating means 161 for the U phase, V-phase modulation ratio calculating means 162 for the V phase, and W-phase modulation ratio calculating means 163 for the W phase.

From the U-phase modulation ratio calculating means 161, V-phase modulation ratio calculating means 162, and W-phase modulation ratio calculating means 163, voltage commands (U-phase voltage command, V-phase voltage command, W-phase voltage command) are outputted to the comparing means 18, and in addition, modulation ratios are outputted through a U-phase modulation ratio signal, a V-phase modulation ratio signal, and a W-phase modulation ratio signal.

The oscillating means 17 outputs a triangle wave signal as a carrier signal.

The comparing means 18 is provided with U-phase comparing means 181 for the U phase, V-phase comparing means 182 for the V phase, and W-phase comparing means 183 for the W phase.

The inverting means 19 is provided with U-phase inverting means 191 for the U phase, V-phase inverting means 192 for the V phase, and W-phase inverting means 193 for the W phase.

Additionally, the inverter 10 is provided with DC voltage measuring means 21 for measuring the input voltage value, a voltage divider 22 for acquiring the reference potentials of the output voltages (U-phase voltage, V-phase voltage, W-phase voltage) from a connection point between a resistor 22a and a resistor 22b connected in series between the positive power line P and the negative power line N, output voltage measuring means 23 for measuring the output voltage of the inverter 10, and output current measuring means 24 for measuring the output current of the inverter 10.

The DC voltage measuring means 21 illustrated in FIG. 1 outputs the voltage value of the input voltage as the input voltage value signal.

The resistors 22a and 22b in the voltage divider 22 are set to the same resistance value for treating a medium voltage of the input voltage as a reference potential.

The output voltage measuring means 23 measures the output voltage of each phase. The output voltage measuring means 23 is provided with U-phase output voltage measuring means 231 for the U phase, V-phase output voltage measuring means 232 for the V phase, and W-phase output voltage measuring means 233 for the W phase.

From the U-phase output voltage measuring means 231, V-phase output voltage measuring means 232, and W-phase output voltage measuring means 233, output voltage values are outputted through a U-phase output voltage value signal, a V-phase output voltage value signal, and a W-phase output voltage value signal.

The output current measuring means 24 measures the output current of each phase. Any of various types of current sensors can be used as the output current measuring means 24. For example, various types of sensors such as a CT sensor, a Hall effect sensor, or a Rogowski coil sensor can be used as the output current measuring means 24. The output current measuring means 24 is provided with U-phase output current measuring means 241 for the U phase, V-phase output current measuring means 242 for the V phase, and W-phase output current measuring means 243 for the W phase. From the U-phase output current measuring means 241, V-phase output current measuring means 242, and W-phase output current measuring means 243, output current values are outputted through a U-phase output current signal, a V-phase output current signal, and a W-phase output current signal.

Next, the configuration of the deterioration estimation device that estimates the deterioration of the IGBTs (upper arms 111 to 131 and lower arms 112 to 132 of the first arm 11 to the third arm 13) which are the switching elements in the inverter 10 will be described on the basis of the drawings.

Figure 2:
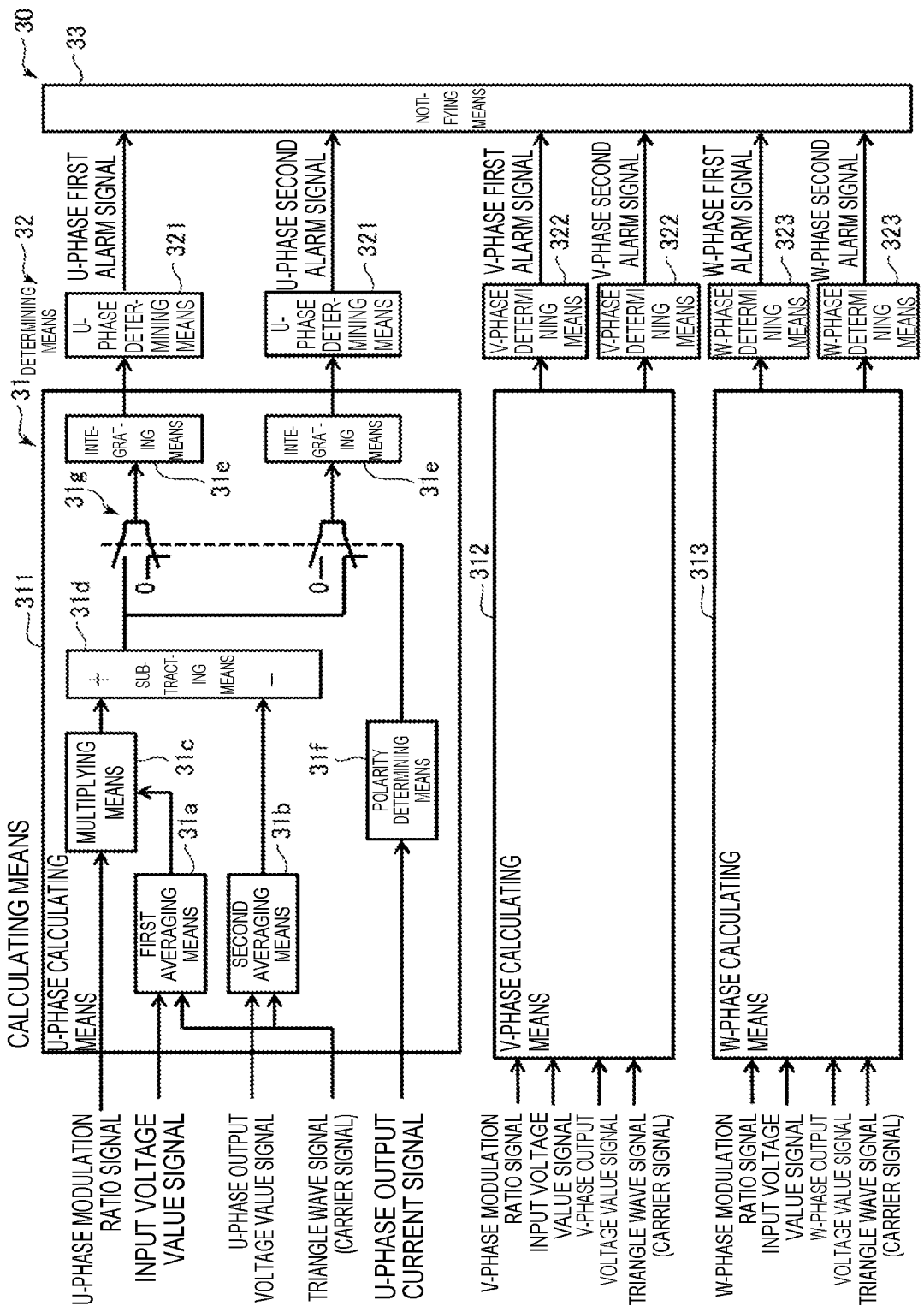
FIG. 2 is a diagram illustrating a deterioration estimation device according to Embodiment 1 of the present invention.

The deterioration estimation device 30 illustrated in FIG. 2 is achieved by causing a computer to run a deterioration estimation program.

In addition, the deterioration estimation device 30 is provided with calculating means 31, determining means 32, and notifying means 33.

The calculating means 31 calculates the delay, which is one example of a variation of the characteristics of a switching element, from a voltage command treated as a target for the output voltage of the inverter 10 illustrated in FIG. 1 and an output voltage value from the inverter 10.

The calculating means 31 is provided with U-phase calculating means 311 for the U phase, V-phase calculating means 312 for the V phase, and W-phase calculating means 313 for the W phase. The U-phase calculating means 311, the V-phase calculating means 312, and the W-phase calculating means 313 have the same configuration.

Each calculating means 31 is provided with first averaging means 31a, second averaging means 31b, multiplying means 31c, subtracting means 31d, integrating means 31e, polarity determining means 31f, and switching means 31g for switching.

The first averaging means 31a averages the input voltage value when the first arm 11 to the third arm 13 are on and off at respective time intervals synchronized with a triangle wave signal (carrier signal).

The second averaging means 31b averages the voltage value indicated by the output voltage value signals (U-phase output voltage value signal, V-phase output voltage value signal, W-phase output voltage value signal) when the first arm 11 to the third arm 13 are on and off at respective time intervals synchronized with the triangle wave signal (carrier signal).

The multiplying means 31c multiplies the voltage value from the first averaging means 31a by the modulation ratio signals (U-phase modulation ratio signal, V-phase modulation ratio signal, W-phase modulation ratio signal) from the voltage commanding means 15 (U-phase voltage commanding means 151, V-phase voltage commanding means 152, W-phase voltage commanding means 153).

The subtracting means 31d subtracts the voltage value from the second averaging means 31b from the voltage value from the multiplying means 31c.

The integrating means 31e outputs the differential integral value obtained by integrating the voltage value from the subtracting means 31d, and is provided in a pair.

The polarity determining means 31f determines the polarity of current according to the output current indicated by the output current signal from the output current measuring means 24 (see FIG. 1) for each phase.

The switching means 31g switches the signal from the subtracting means 31d to one of the integrating means 31e or the other of the integrating means 31e according to a switching signal from the polarity determining means 31f.

The determining means 32 detects whether the voltage value from the calculating means 31 has changed from the initial state by a threshold value or greater, and thereby detects a delay abnormality of the upper arms 111 to 131 and the lower arms 112 to 132 in the first arm 11 to the third arm 13 which are the switching elements. The threshold value can be set to any value according to the individual characteristics, individual differences, and loads of the switching elements.

The determining means 32 is provided with U-phase determining means 321 for the U phase, V-phase determining means 322 for the V phase, and W-phase determining means 323 for the W phase.

The U-phase determining means 321 for the U phase, V-phase determining means 322 for the V phase, and W-phase determining means 323 for the W phase are provided in pairs for each phase to determine the differential integral value from each of one of the integrating means 31e and the other of the integrating means 31e.

The notifying means 33 notifies a user, a worker, or a person in charge of maintenance about the detection of an abnormality from the determining means 32.

The operations of the deterioration estimation device 30 according to Embodiment 1 of the present invention configured as above will be described on the basis of the drawings. Note that a description of the U phase will be represented for the description of Embodiment 1.

Description of Operations of Inverter 10

First, the operations of the inverter 10 illustrated in FIG. 1 will be described.

A voltage command signal is outputted from the U-phase voltage commanding means 151. On the basis of the voltage command designated by the voltage command signal, the U-phase modulation ratio calculating means 161 outputs a U-phase modulation ratio signal indicating the modulation ratio.

The U-phase comparing means 181 compares the voltage according to the triangle wave signal from the oscillating means 17 to the U-phase voltage command from the U-phase voltage commanding means 151 (U-phase modulation ratio calculating means 161), and in the period in which the U-phase voltage command is higher than the triangle wave signal, outputs an upper-arm PWM signal for turning on the upper arm 111 of the first arm 11. Also, in the period in which the U-phase command voltage is lower than the triangle wave signal, the U-phase inverting means 191 outputs a lower-arm PWM signal for turning on the lower arm 112 of the first arm 11. By repeating the above operations, the three-phase AC motor M can obtain alternating current as the U-phase output.

Description of Operations of Deterioration Estimation Device 30

As an advance sign of trouble in an IGBT (switching element), it is anticipated that the output voltage of the inverter 10 will no longer follow the voltage command (the error will be larger than normal).

Accordingly, first, as illustrated in FIG. 2, the deterioration estimation device 30 uses the first averaging means 31a to average the input voltage value indicated by the input voltage value signal from the DC voltage measuring means 21 (see FIG. 1) in a half cycle of the triangle wave signal from the oscillating means 17. Additionally, the multiplying means 31c multiplies the average value of the input voltage value from the first averaging means 31a by the modulation ratio indicated by the U-phase modulation ratio signal from the U-phase voltage commanding means 151. Through the multiplication by the multiplying means 31c, the average value of the U-phase voltage command is calculated.

Also, on the basis of the triangle wave signal from the oscillating means 17, the second averaging means 31b averages the output voltage value indicated by the U-phase output voltage value signal from the U-phase output voltage measuring means 231 (see FIG. 1) in a half cycle of the triangle wave signal.

In Embodiment 1, the first averaging means 31a and the second averaging means 31b use a half cycle of the triangle wave signal, but it is sufficient for the timing to be synchronized with the triangle wave signal, and therefore a full cycle may also be used.

Figure 3:
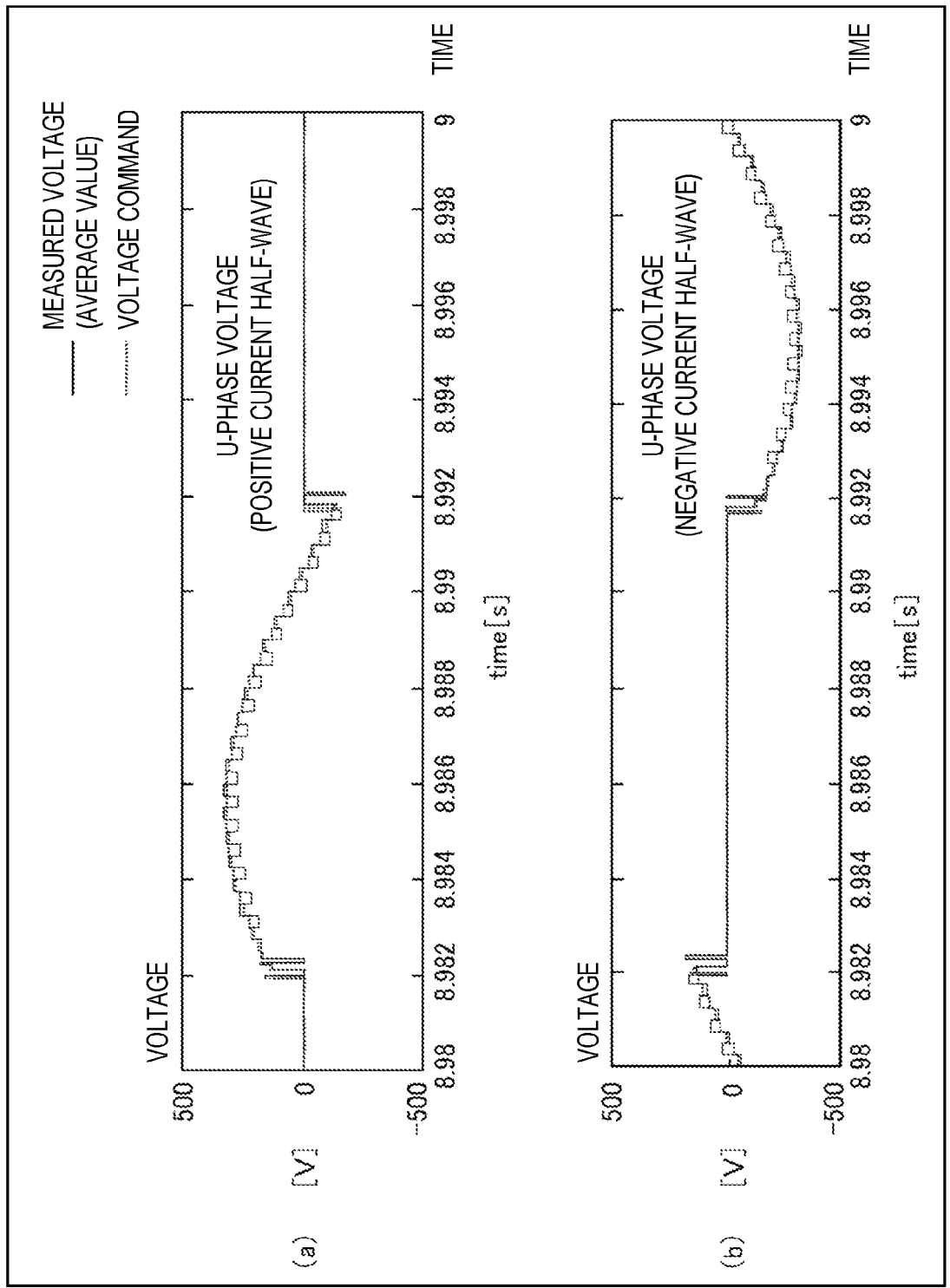
FIG. 3(a) is a diagram illustrating an example of waveforms indicating the average value of a U-phase voltage command from the multiplying means and the average value of the output voltage value from the second averaging means when the polarity of the output current is positive.
FIG. 3(b) is a diagram illustrating an example of waveforms indicating the average value of the U-phase voltage command from the multiplying means and the average value of the output voltage value from the second averaging means when the polarity of the output current is negative.

FIG. 3(a) illustrates the average value of the U-phase voltage command from the multiplying means 31c and the average value of the output voltage value from the second averaging means 31b. In this way, by averaging the U-phase voltage command and averaging the output voltage value, the respective waveforms of the voltage command and the output voltage value can be easily understood visually.

Next, the subtracting means 31d calculates the difference by subtracting the average value of the U-phase output voltage value from the second averaging means 31b from the average value of the U-phase voltage command from the multiplying means 31c, and thereby calculates the delay of the upper arm 111 of the first arm 11 which is a switching element.

Thereafter, the polarity determining means 31f determines the polarity of current according to the output current indicated by the U-phase output current signal, and switches the switching means 31g according to the switching signal.

According to the switching signal, when the polarity of the output current is positive, the difference from the subtracting means 31d is integrated by one of the integrating means 31e (in FIG. 2, the integrating means 31e on the top). Also, when the polarity of the output current is negative, the difference from the subtracting means 31d is integrated by the other of the integrating means 31e (in FIG. 2, the integrating means 31e on the bottom).

Here, FIG. 3(a) illustrates the average value of the U-phase voltage command from the multiplying means 31c and the average value of the output voltage value from the second averaging means 31b when the polarity of the output current is positive.

Also, FIG. 3(b) illustrates the average value of the U-phase voltage command from the multiplying means 31c and the average value of the output voltage value from the second averaging means 31b when the polarity of the output current is negative.

In addition, the output (variation of characteristics) from one of the integrating means 31e (in FIG. 2, refer to the integrating means 31e on the top) when the off-delays of the upper arm 111 and the lower arm 112 are in an initial state (4 µs) is illustrated in FIG. 4(a).

Moreover, the output from the other of the integrating means 31e (in FIG. 2, refer to the integrating means 31e on the bottom) when the delay is the same as the delay state in FIG. 4(a) is illustrated in FIG. 4(b).

The waveforms illustrated in FIGS. 4(a) and 4(b) are obtained in a state in which the three-phase AC motor M (see FIG. 1) has a fixed number of revolutions and a fixed load, and are obtained by starting the integrations by the integrating means 31e, 31e from the time 10 s.

As FIGS. 4(a) and 4(b) demonstrate, the outputs from the integrating means 31e, 31e rise or fall on a prescribed slope.

For example, if both the upper arms 111 to 131 and the lower arms 112 to 132 illustrated in FIG. 1 deteriorate, the characteristics change, and the off-delay increases, the slopes of both waveforms illustrated in FIGS. 4(a) and 4(b) will be gentle. At this time, if there is no switching means 31g and the difference from the subtracting means 31d is integrated by singular integrating means 31e, the positive and negative values will be added together and cancel each other out, and consequently, signs of abnormality cannot be detected.

However, in the deterioration estimation device 30, it is determined whether the upper arms 111 to 131 or the lower arms 112 to 132 have deteriorated on the basis of the direction of the current outputted from the first arm 11 to the third arm 13.

As an example of a change in the characteristics of the upper arm 111, assume that the delay when being switched off has increased from 4 µs to 8 µs. Note that the off-delay of the lower arm 112 is still in the initial state (a delay of 4 µs).

The output from one of the integrating means 31e at this time is illustrated in FIG. 5(a). Also, the output from the other of the integrating means 31e is illustrated in FIG. 5(b).

Figure 4:
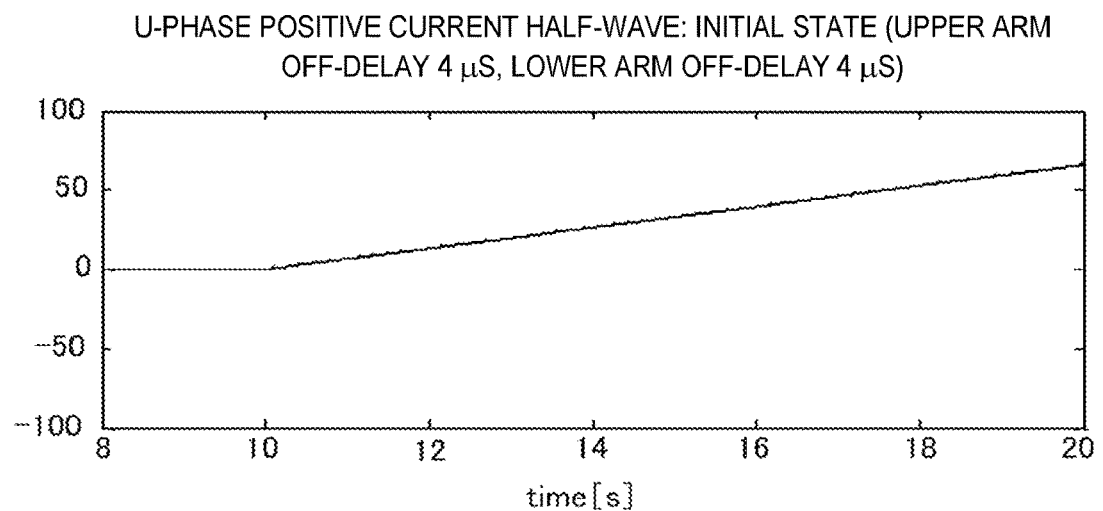
Figure 4:
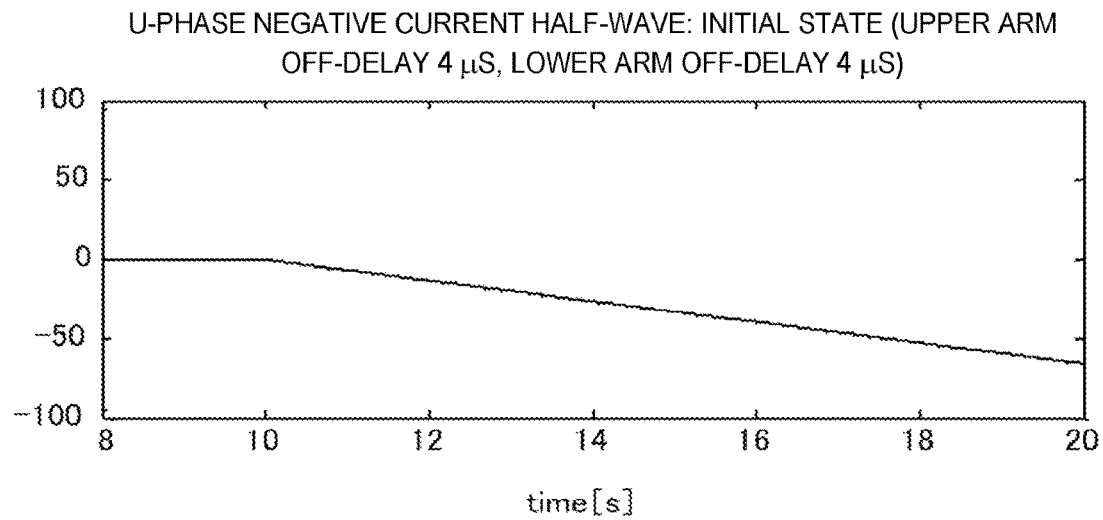

The waveforms illustrated in FIGS. 5(a) and 5(b), similarly to FIG. 4, are also obtained in a state in which the three-phase AC motor M (see FIG. 1) has a fixed number of revolutions and a fixed load, and are obtained by starting the integrations by the integrating means 31e, 31e from the time 10 s.

In FIG. 5(b), there is no change from FIG. 4(b), but in FIG. 5(a) it can be seen that the slope of the off-delay has become gentler from the initial state.

Consequently, the variation of the characteristics is such that the difference from the initial state is larger, and one of the U-phase determining means 321 can determine that the upper arm 111 has deteriorated by detecting that the change from the initial state is equal to or greater than a threshold value. Moreover, one of the U-phase determining means 321 can inform the notifying means 33 of a U-phase first alarm signal.

Next, assume that, for example, the off-delay of the upper arm 111 is still in the initial state (a delay of 4 µs), but the delay of the lower arm 112 when being switched off has increased from 4 µs to 8 µs. The output from one of the integrating means 31e at this time is illustrated in FIG. 6(a). Also, the output from the other of the integrating means 31e is illustrated in FIG. 6(b).

The waveforms illustrated in FIGS. 6(a) and 6(b), similarly to FIG. 4, are also obtained in a state in which the three-phase AC motor M (see FIG. 1) has a fixed number of revolutions and a fixed load, and are obtained by starting the integrations by the integrating means 31e, 31e from the time 10 s.

In FIG. 6(a), there is no change from FIG. 4(a), but in FIG. 6(b) it can be seen that the slope of the delay has become gentler from the initial state.

Consequently, the difference from the initial state is larger, and the other of the U-phase determining means 321 can determine that the lower arm 112 has deteriorated by detecting that the change from the initial state is equal to or greater than a threshold value. Moreover, the other of the U-phase determining means 321 can inform the notifying means 33 of a U-phase second alarm signal.

Furthermore, in the case where both off-delays of the upper arm 111 and the lower arm 112 have increased from 4 μs to 8 μs, the output voltage of the upper arm 111 for which the current is a positive value becomes the waveform illustrated by FIG. 5(a), and the output voltage of the lower arm 112 for which the current has a negative value becomes the waveform illustrated by FIG. 6(b).

Consequently, since it is understood that a change has occurred from the waveforms illustrated in FIG. 5(b) and FIG. 6(a) which illustrate the normal state, by detecting that the change has become equal to or greater than a threshold value, the notifying means 33 can be informed of a U-phase first alarm signal with which the deterioration of both the upper arm 111 and the lower arm 112 can be estimated.

Also, by using the integrating means 31e, 31e illustrated in FIG. 2 to integrate the on-delays and off-delays (difference) from the subtracting means 31d, tiny fluctuations or the like in the voltage value can be ignored, and since the difference is accumulated, signs of deterioration can be magnified.

In addition, by informing the notifying means 33 of the abnormality, a user, an administrator, a person in charge of maintenance, or the like can be informed of the possibility of trouble in the inverter 10 (see FIG. 1). The notification can be issued according to various methods, such as with light from a lamp or the like, with sound from a speaker, or through email over the Internet.

As above, according to the deterioration estimation device 30 according to Embodiment 1, by having the calculating means 31 calculate the variation of the characteristics of an IGBT from the voltage command treated as a target for the output voltage of the inverter 10 and the output voltage value from the inverter 10, and by having the determining means 32 determine whether the change in the variation of the characteristics is equal to or greater than a threshold value, the notifying means 33 can issue a warning when the determining means 32 has determined that the change is equal to or greater than the threshold value.

The voltage command with respect to the inverter 10 and the output voltage value and output current of the inverter 10 can be acquired from the DC voltage measuring means 21, the output voltage measuring means 23, and the output current measuring means 24 provided in the inverter 10, and therefore the deterioration estimation device 30 can estimate the deterioration of an IGBT which is a switching element without providing a special sensor.

Also, by switching the integrating means 31e and making respective determinations when the polarity of the output current is positive and when the polarity is negative, it is possible to determine whether the upper arm 111, the lower arm 112, or both have deteriorated.

Furthermore, since the calculating means 31 and the determining means 32 are provided respectively for each of the U, V, and W phases, the deterioration in each of the phases can be detected.

In the above description, an example of an increase in the off-delay is described in regard to detecting the variation of the characteristics through subtraction of the voltage command to the inverter 10, which is one example of a power conversion device, and the output voltage value from the inverter 10. However, it is also possible to detect the on-delay, the off-delay, the on-voltage, the on-resistance, dv/dt (rate of voltage change), or the like as a change in the characteristics of a switching element.

In Embodiment 1, the calculating means 31 uses the first averaging means 31a to average the input voltage value indicated by the input voltage value signal, and also uses the second averaging means 31b to average the output voltage value. With this configuration, the waveforms illustrated in FIGS. 3(a) and 3(b) can be obtained, and therefore a worker can observe the waveforms during maintenance or the like and easily grasp the operating state of the inverter 10.

However, if it is not necessary to obtain the waveforms illustrated in FIGS. 3(a) and 3(b), the first averaging means 31a and the second averaging means 31b can be omitted since the difference is integrated by the integrating means 31e downstream from the subtracting means 31d.

Embodiment 2

Next, a deterioration estimation device according to Embodiment 2 of the present invention will be described.

In the pair of integrating means 31e illustrated in FIG. 2, since the difference is integrated, the differential integral value increasingly diverges over time.

Accordingly, in the integration by the integrating means 31e, a definite integral over a predetermined interval (interval integral) is evaluated to obtain the differential integral value. Hereinafter, this operation is referred to as the interval integral.

The interval integral can be found by the following expression (1) when the interval is set to 5 s, for example.

[Expression 1]

$$\int_{T-5}^{T} e(t) dt \tag{1}$$

Here, T is any time and e(t) is the integral value from the integrating means 31e.

Figure 7:
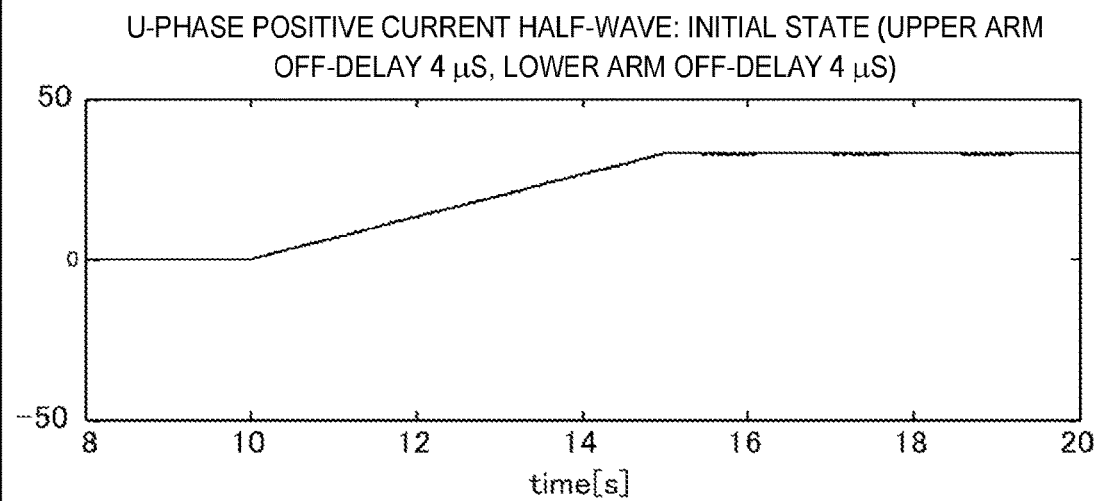
Figure 7:
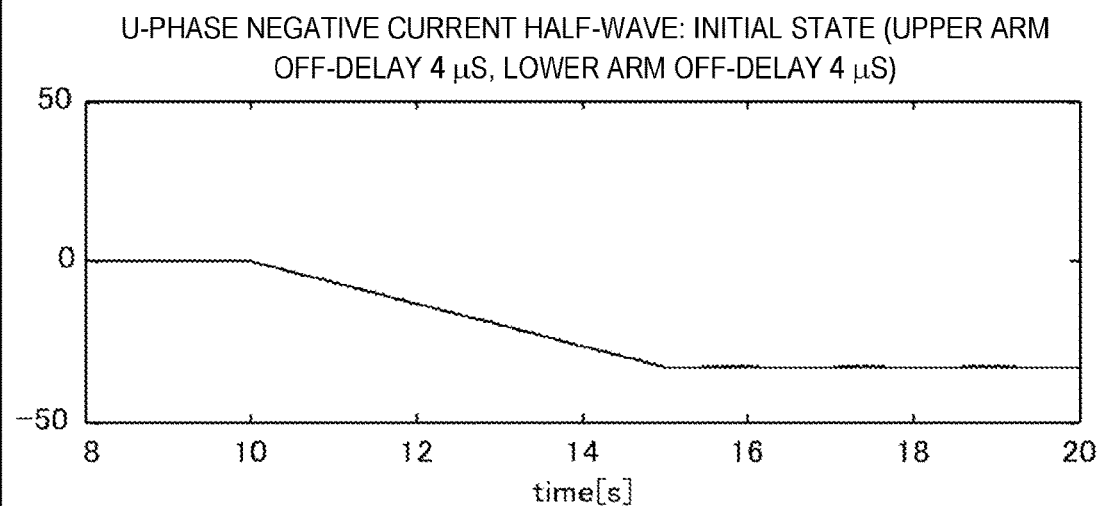
Figure 8:
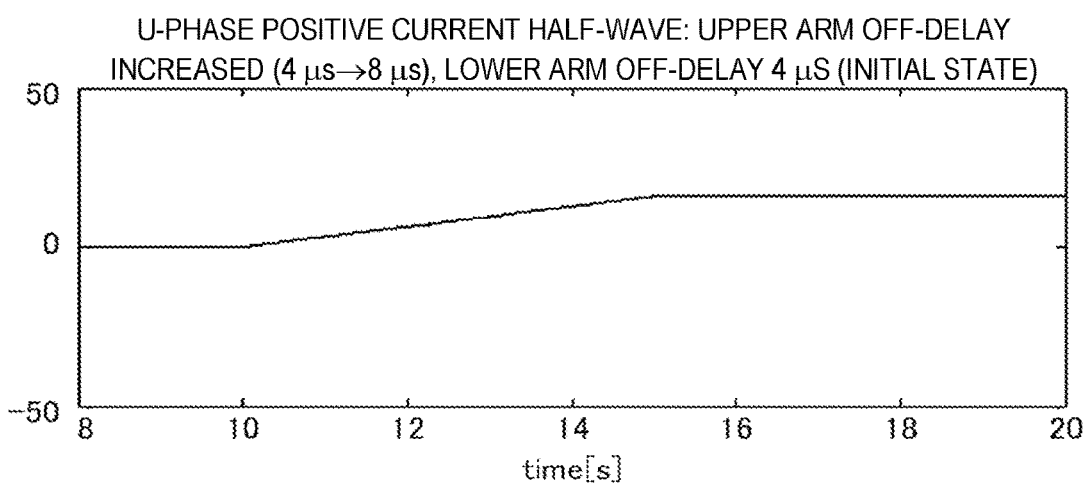
Figure 8:
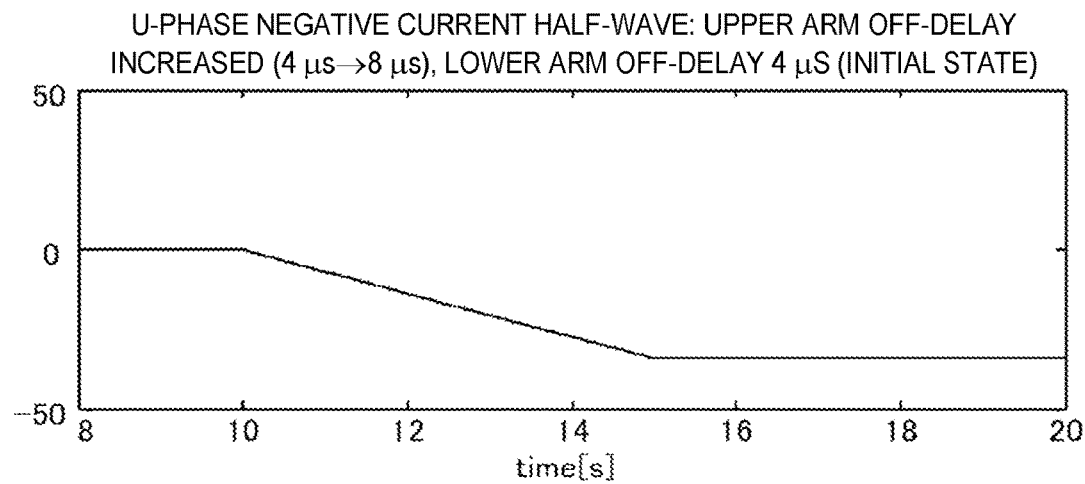
Figure 9:
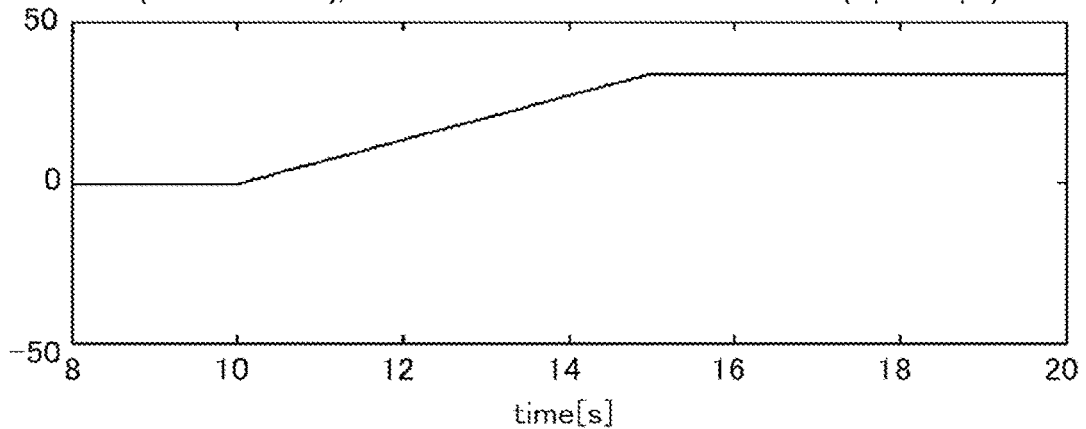
Figure 9:
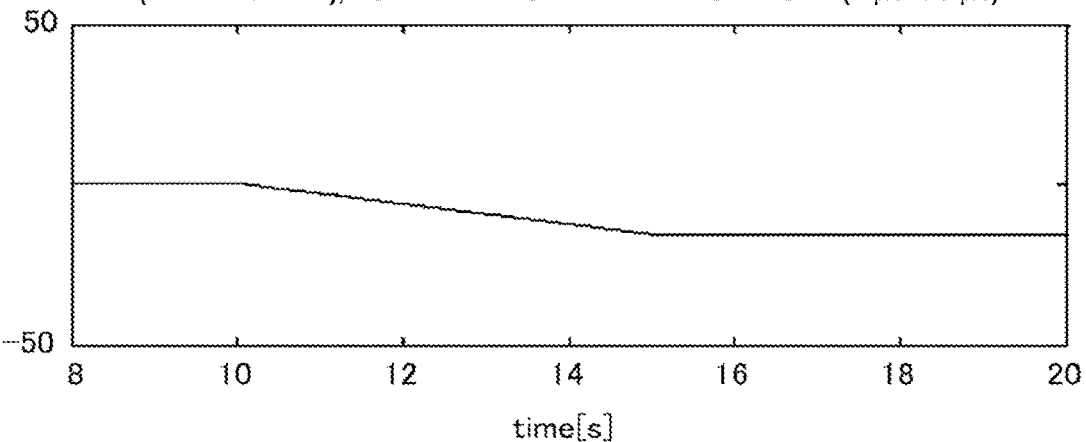

FIGS. 7 to 9 illustrate waveforms when the three-phase AC motor M illustrated in FIG. 1 is driven by the inverter 10 and the differential integral value from the integrating means 31e is calculated by setting the predetermined interval to 5 s, for example.

The waveforms illustrated in FIGS. 7(a) and 7(b) correspond to FIG. 4 which illustrates the waveforms when the off-delay of the upper arm 111 and the off-delay of the lower arm 112 are in the initial state (4 μs), and illustrate the case where the integral of the difference is replaced by the interval integral.

Also, the waveforms illustrated in FIGS. 8(a) and 8(b) correspond to FIGS. 5(a) and 5(b) which illustrate the waveforms when the off-delay of the upper arm 111 is increased from 4 μs to 8 μs and the off-delay of the lower arm 112 is in the initial state (4 μs), and illustrate the case where the integral of the difference is replaced by the interval integral.

Moreover, the waveforms illustrated in FIGS. 9(a) and 9(b) correspond to FIGS. 6(a) and 6(b) which illustrate the waveforms when the off-delay of the upper arm 111 is in the initial state (4 μs) and the off-delay of the lower arm 112 is increased from 4 μs to 8 μs, and illustrate the case where the integral of the difference is replaced by the interval integral.

In Embodiment 2, the integral is over a 5 s interval and therefore becomes a constant value 5 s after the integral start (time 10 s) as illustrated in FIGS. 7 to 9.

Figure 5:
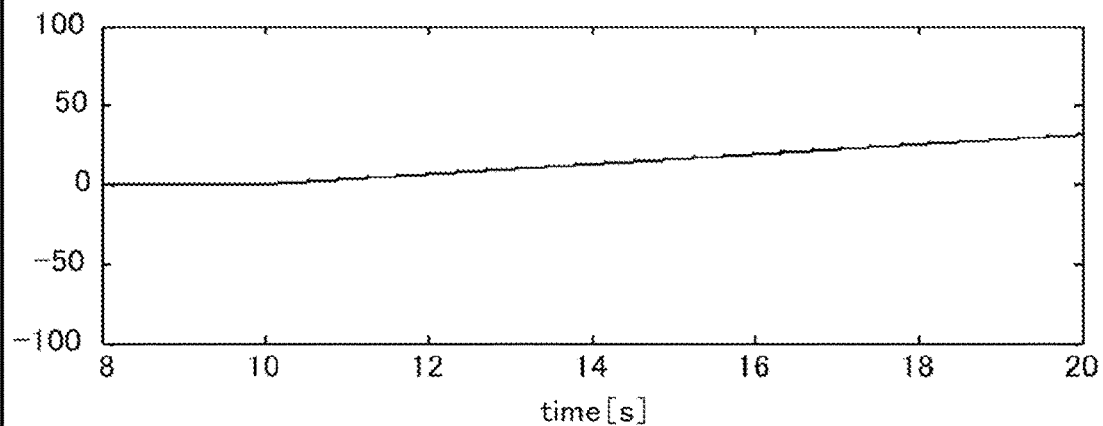
Figure 5:
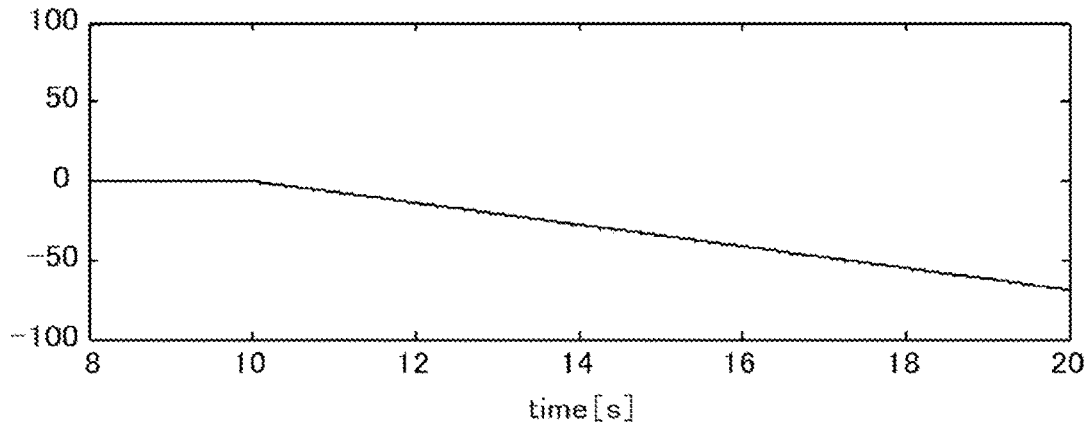
Figure 6:
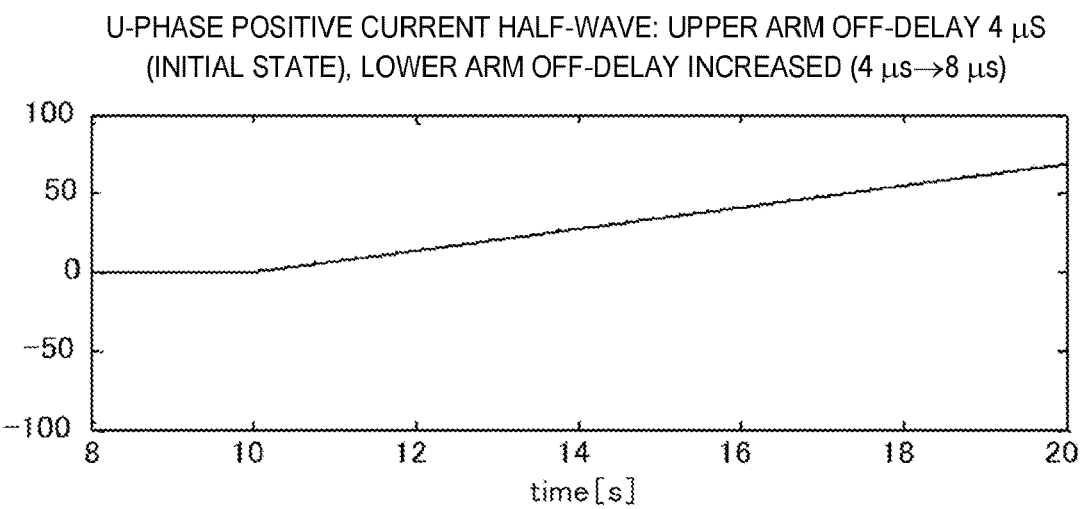
Figure 6:
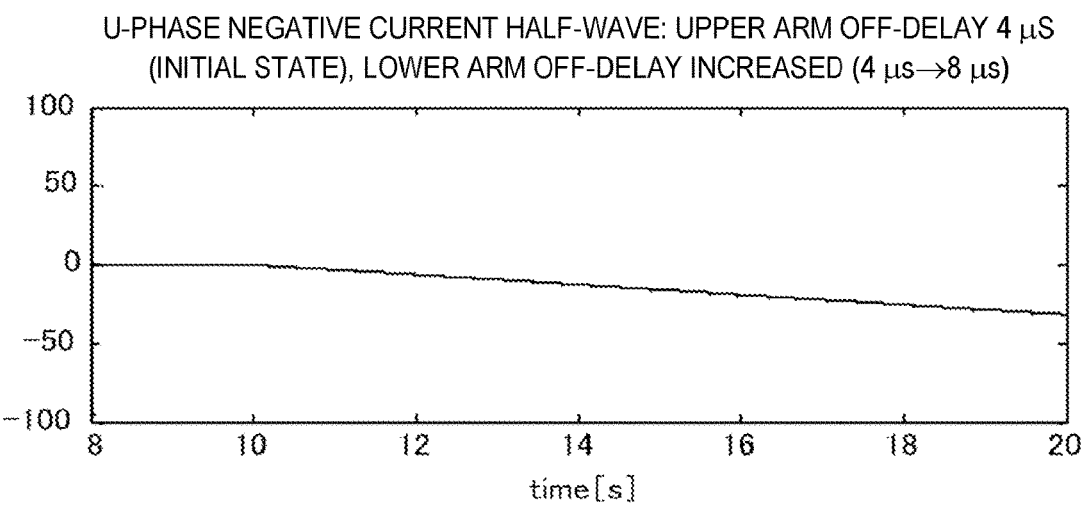

In both FIGS. 8 and 9, the slopes of the waveforms become gentler with increasing delay, similarly to the waveforms illustrated in FIGS. 4 to 6, and therefore by detecting that the change from the initial state is equal to or greater than a threshold value, the deterioration of the delay characteristics of a switching element can be detected.

Also, as illustrated in FIGS. 8 and 9, by having the integrating means 31e evaluate an interval integral to obtain the differential integral value, divergent integral values can be suppressed.

Embodiment 3

Next, a deterioration estimation device according to Embodiment 3 of the present invention will be described.

The delay of the IGBTs constituting the first arm 11 to the third arm 13 in the inverter 10 illustrated in FIG. 1 is calculated by the differential integral value from the pair of integrating means 31e illustrated in FIG. 2. However, the differential integral value is influenced by the load current. For example, the delay of the IGBTs constituting the first arm 11 to the third arm 13 is different between the unloaded state and the state in which a predetermined current is flowing as the output current.

Accordingly, in the determining means 32, the output voltage from the first arm 11 to the third arm 13 of each phase is inputted, the differential integral value indicating the delay corresponding to the output voltage is stored and treated as an initial state, and a threshold value is determined on the basis of the initial state. With this configuration, the threshold value for the variation of the characteristics can be determined according to the load current (output current), and therefore the deterioration of a switching element (IGBT) can be estimated accurately.

Note that Embodiments 1 to 4 describe an example of a two-level inverter 10 including upper arms 111 to 131 and lower arms 112 to 132, as illustrated in FIG. 1, but the deterioration estimation device of the present invention can also be applied to a three-level inverter.

Also, in the embodiments, as illustrated in FIG. 1, the output voltage measuring means 23 including the U-phase output voltage measuring means 231 for the U phase, the V-phase output voltage measuring means 232 for the V phase, and the W-phase output voltage measuring means 233 for the W phase measures and outputs the output voltage of each phase as a U-phase output voltage value signal, a V-phase output voltage value signal, and a W-phase output voltage value signal.

However, the output voltage may not only be treated as a phase voltage but also as a line voltage.

Figure 10:
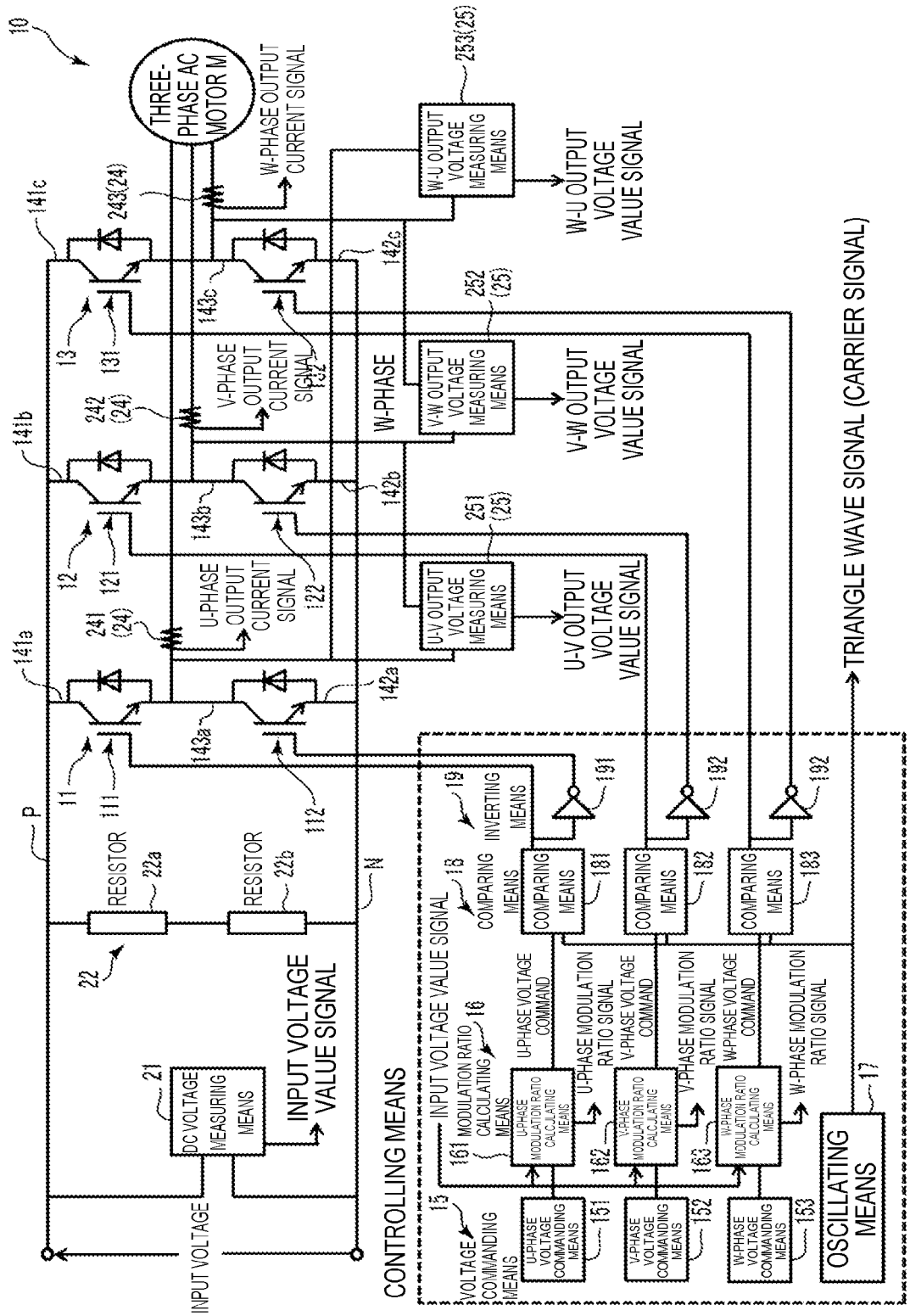
FIG. 10 is a diagram for explaining that the output voltage of the power conversion device is treated as a line voltage rather than a phase voltage.

For example, that which outputs the output voltage to the U-phase calculating means 311 illustrated in FIG. 2 can be configured to be a U-V output voltage value signal from U-V output voltage measuring means 251 as illustrated in FIG. 10 instead of the U-phase output voltage value signal. In this case, a signal of "U-phase modulation ratio signal-V-phase modulation ratio signal" is used instead of the U-phase modulation ratio signal of the U-phase calculating means 311.

For example, that which outputs the output voltage to the V-phase calculating means 312 illustrated in FIG. 2 can be configured to be a V-W output voltage value signal from V-W output voltage measuring means 252 as illustrated in FIG. 10 instead of the V-phase output voltage value signal. In this case, a signal of "V-phase modulation ratio signal-W-phase modulation ratio signal" is used instead of the V-phase modulation ratio signal of the V-phase calculating means 312.

Moreover, that which outputs the output voltage to the W-phase calculating means 313 illustrated in FIG. 2 can be configured to be a W-U output voltage value signal from W-U output voltage measuring means 253 as illustrated in FIG. 10 instead of the W-phase output voltage value signal. In this case, a signal of "W-phase modulation ratio signal-U-phase modulation ratio signal" is used instead of the W-phase modulation ratio signal of the W-phase calculating means 313.

Even if such output voltage measuring means 25 (U-V output voltage measuring means 251, V-W output voltage measuring means 252, W-U output voltage measuring means 253) for measuring line voltages is used, the output voltage can be measured and the calculating means 31 can calculate the delay which is one example of a variation of the characteristics of a switching element.

INDUSTRIAL APPLICABILITY

The present invention can estimate the deterioration of a power conversion device and is therefore suitable for a power supply that supplies power to a mission-critical system from a simple power supply or the like.

REFERENCE SIGNS LIST 10 inverter
11 first arm
12 second arm
13 third arm
111, 121, 131 upper arm
112, 122, 132 lower arm
141a to 141c first wiring line
142a to 142c second wiring line
143a to 143c third wiring line
15 voltage commanding means
151 U-phase voltage commanding means
152 V-phase voltage commanding means
153 W-phase voltage commanding means
16 modulation ratio calculating means
161 U-phase modulation ratio calculating means
162 V-phase modulation ratio calculating means
163 W-phase modulation ratio calculating means
17 oscillating means
18 comparing means
181 U-phase comparing means
182 V-phase comparing means
183 W-phase comparing means
19 inverting means
191 U-phase inverting means
192 V-phase inverting means
193 W-phase inverting means
21 DC voltage measuring means
22 voltage divider
22a, 22b resistor
23 output voltage measuring means
231 U-phase output voltage measuring means
232 V-phase output voltage measuring means
233 W-phase output voltage measuring means
24 output current measuring means
241 U-phase output current measuring means
242 V-phase output current measuring means
243 W-phase output current measuring means
25 output voltage measuring means
251 U-V output voltage measuring means
252 V-W output voltage measuring means
253 W-U output voltage measuring means
30 deterioration estimation device
31 calculating means 311 U-phase calculating means
312 V-phase calculating means
313 W-phase calculating means
31a first averaging means
31b second averaging means
31c multiplying means
31d subtracting means
31e integrating means
31f polarity determining means
31g switching means
32 determining means
321 U-phase determining means
322 V-phase determining means
323 W-phase determining means
33 notifying means
P positive power line
N negative power line
M three-phase AC motor

The invention claimed is:

1. A deterioration estimation device for a power conversion device outputting an AC current, the deterioration estimation device comprising:
calculating means for calculating a variation of characteristics of switching elements for power conversion in the power conversion device from a voltage command treated as a target for an output voltage of the power conversion device and an output voltage value of the power conversion device, the calculating means comprising a subtracting means for calculating a difference between the voltage command and the output voltage value;
determining means for determining whether the variation of the characteristics calculated by the calculating means has changed from an initial state by a threshold value or greater, the determining means comprising a first unit for receiving a variation of characteristics signal from a first integrating means, and a second unit for receiving a variation of characteristics signal from a second integrating means; and
notifying means for issuing a warning when the determining means has determined that the change in the variation of the characteristics is equal to or greater than the threshold value, wherein
the calculating means includes polarity determining means for determining a polarity of the AC current outputted from the power conversion device including an upper arm comprising a first switching element among the switching elements and a lower arm comprising a second switching element among the switching elements, and switching means configured to switch the signal from the subtracting means to the first integrating means when the switching signal from the polarity determining means indicates that a positive polarity of the AC current is detected, and switch the signal from the subtracting means to the second integrating means when the switching signal from the polarity determining means indicates that a negative polarity of the AC current is detected, and
the determining means includes a pair of units each of which is respectively configured to determine the variation of the characteristics switched by the switching means.

2. The deterioration estimation device according to claim 1, wherein the determining means stores and treats is configured to store the variation of the characteristics corresponding to the output voltage value of the power conversion device, the stored variation of the characteristics being treated as an initial state, and the determining means is configured to determine the threshold value on a basis of the initial state.

3. The deterioration estimation device according to claim 1, wherein the first and second integrating means are configured to output an integral value from a definite integral over a predetermined interval as the differential integral value.

4. The deterioration estimation device according to claim 1, wherein the calculating means includes first averaging means for calculating an average value of an input voltage value into the power conversion device at respective time intervals synchronized with a carrier signal, multiplying means for multiplying the average value of the input voltage value from the first averaging means by a modulation ratio to calculate and output the voltage command to the subtracting means, and second averaging means for calculating and outputting, to the subtracting means, an average value of the output voltage value of the power conversion device at respective time intervals synchronized with the carrier signal.

5. A non-transitory computer-readable medium storing thereon a deterioration estimation program for a power conversion device outputting an AC current, the deterioration estimation program causing a computer to function as:
calculating means for calculating a variation of characteristics of switching elements for power conversion in the power conversion device from a voltage command treated as a target for an output voltage of the power conversion device and an output voltage value of the power conversion device, the calculating means comprising a subtracting means for calculating a difference between the voltage command and the output voltage value;
determining means for determining whether the variation of the characteristics calculated by the calculating means has changed from an initial state by a threshold value or greater, the determining means comprising a first unit for receiving a variation of characteristics signal from a first integrating means, and a second unit for receiving a variation of characteristics signal from a second integrating means; and
notifying means for issuing a warning when the determining means has determined that the change in the variation of the characteristics is equal to or greater than the threshold value, wherein
the calculating means includes polarity determining means for determining a polarity of the AC current outputted from the power conversion device including an upper arm comprising a first switching element among the switching elements and a lower arm comprising a second switching element among the switching elements, and switching means configured to switch the signal from the subtracting means to the first integrating means when the switching signal from the polarity determining means indicates that a positive polarity of the AC current is detected, and switch the signal from the subtracting means to the second integrating means when the switching signal from the polarity determining means indicates that a negative polarity of the AC current is detected, and
the determining means includes a pair of units each of which is respectively configured to determine the variation of the characteristics switched by the switching means.

* * * * *